United States Patent [19]
Wakamatsu

[11] Patent Number: 5,878,060
[45] Date of Patent: Mar. 2, 1999

[54] VITERBI DECODING APPARATUS AND VITERBE DECODING METHOD

[75] Inventor: Masataka Wakamatsu, Kanagawa, Japan

[73] Assignee: Sony Corporation, Tokyo, Japan

[21] Appl. No.: 822,501

[22] Filed: Mar. 24, 1997

[30] Foreign Application Priority Data

Mar. 28, 1996 [JP] Japan .................................. 8-073847

[51] Int. Cl.⁶ ............................................... H03M 13/12
[52] U.S. Cl. .................................................. 371/43.7
[58] Field of Search ............................................ 371/43.7

[56] References Cited

U.S. PATENT DOCUMENTS 5,430,768  7/1995  Minuhin et al. .......................... 375/340

OTHER PUBLICATIONS

Rae, J., et al., "Design and Performance of a VLSI 120 Mb/s Trellis–Coded Partial Response Channel", IEEE Transaction on Magnetics, vol. 31, No. 2, Mar. 1995, pp. 1208–1214.

*Primary Examiner*—Stephen M. Baker
*Attorney, Agent, or Firm*—Frommer Lawrence & Haug LLP.; William S. Frommer

[57] ABSTRACT

Survivor sequences information is supplied to a RAM 61-1 and a RAM 61-2 as an input Din. The RAM 61-1 and the RAM 61-2 perform an interleaving operation and store the survivor sequences information alternately in accordance with a clock CK1 and a clock CK2 differing in phase from the clock CK1 by half a period. The phases of the clock CK1 and the phase of the clock CK2 are delayed by half a period when a write operation is switched to a read operation with data being outputted at a selector 62 in an appropriate order accordingly. Traced-back data is then inputted from terminal A and terminal B to the selector 62 and outputted from a terminal X after one of these items of data has been selected at a prescribed timing.

11 Claims, 16 Drawing Sheets

33

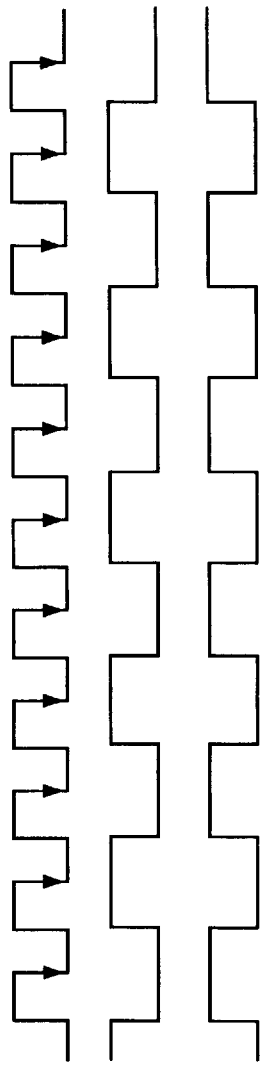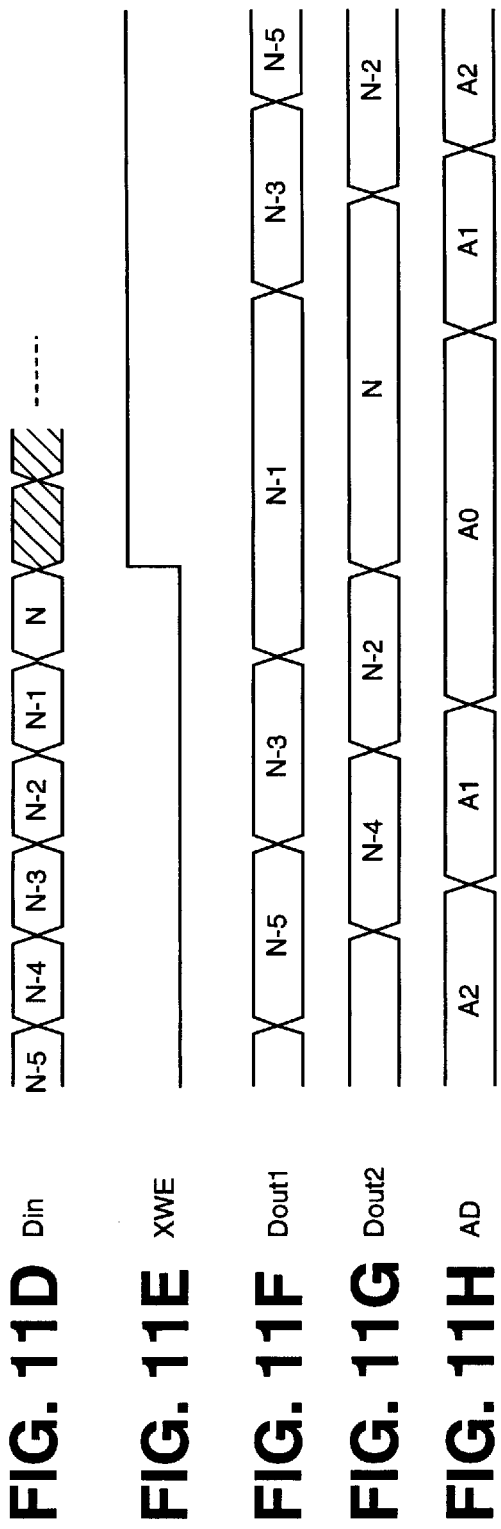

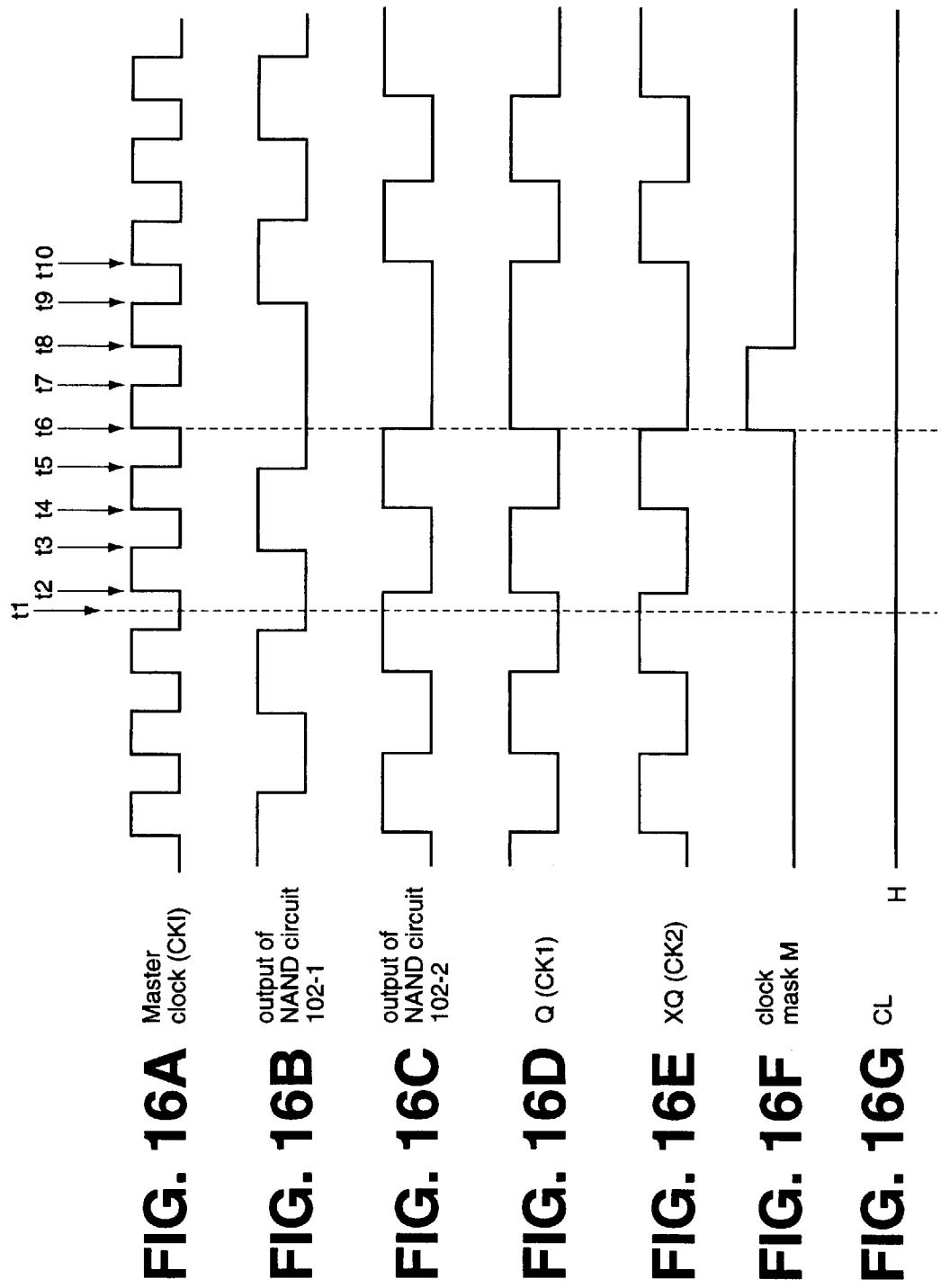

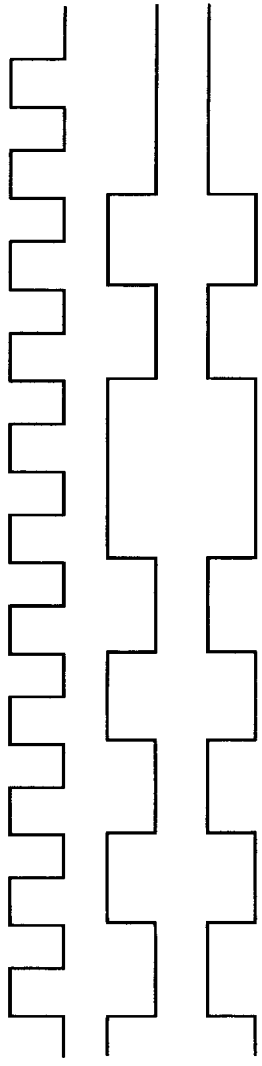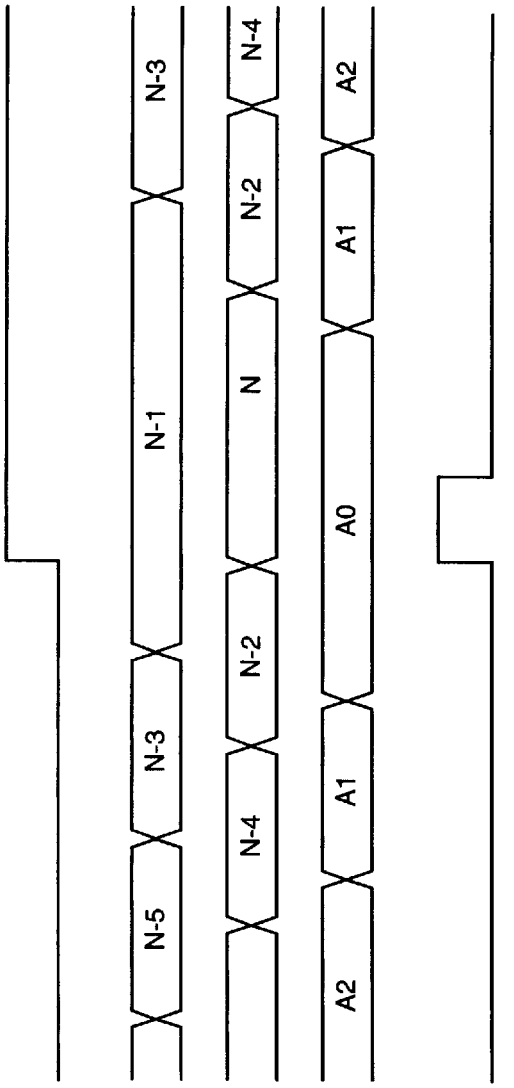
FIG. 17A master clock CK
FIG. 17B CK1
FIG. 17C CK2
FIG. 17D Din
FIG. 17E XWE
FIG. 17F Dout1
FIG. 17G Dout2
FIG. 17H AD
FIG. 17I clock mask M

VITERBI DECODING APPARATUS AND VITERBE DECODING METHOD

BACKGROUND OF THE INVENTION

The present invention relates to a Viterbi decoding device and a Viterbi decoding method, and more particularly relates to a Viterbi decoding apparatus and Viterbi decoding method of actually performing high-speed Viterbi decoding in a form of traceback where reading out and writing of survivor sequences information is carried out alternately at two path memories.

Data signals transmission has been carried out with the data signal being coded for the purpose of making errors correctable which are due to noise occurring in the data transmission process.

FIG. 1 shows the configuration of an example of a coding apparatus 1 for carrying out convolutional coding of a constraint length of 3 and a coding rate of ½.

The coding apparatus 1 comprises a three-bit shift register comprising registers R1, R2 and R3 together with two exclusive OR circuits (exclusive OR circuit E1 and exclusive OR circuit E2).

The exclusive OR circuit E1 carries out an exclusive OR operation on the information bits of registers R1, R2 and R3 and outputs the result as value X1. The exclusive OR circuit E2 then performs an exclusive OR operation on the information bits for registers R1 and R3 and outputs the result as the value X2.

When one bit of information is inputted to the register R1, the information bit stored in the register R1 is shifted to the register R2 and the information bit stored in the register R2 is shifted to register R3.

When the value of the information bit stored in the register R1 is a and the value of the information bit stored in the register R2 is b, suppose that one bit of information In is inputted to the register R1 and a value X1 and a value X2 are outputted.

The value of the information bits stored in registers R1, R2 and R3 at this time are the values of the inputted information bit In, the values a and b, respectively. Then, the number of states for the coding apparatus 1 at the time the one bit of information is inputted is therefore decided by the combination (a, b). Namely, in this case, there exist four states (0, 0), (0, 1), (1, 0) and (1, 1). Generally, the number of states when the number of registers is n (the constraint length is n) can be expressed by 2^(n−1) (where ^ indicates that the following number is an exponent).

FIG. 2 is a trellis line diagram corresponding to the coding apparatus 1.

In FIG. 2, the states that can be obtained at the coding apparatus 1 are shown as the states 0 to 3, with the values X1 and X2 outputted in accordance with the information bits inputted at the time of each of these states being shown as (X1, X2). Here, the state transitions when 0 is inputted as the information bit are shown by solid lines and state transitions when 1 is inputted are shown as dotted lines.

For example, when the state is 0 (a=b=0), for 0 being inputted as an information bit, (00) (X1=0 and X2=0) are outputted and a transition is made to state 0 (the state does not change). Further, when the state is 0 (a=b=0) and 1 is inputted as an information bit, (11) (X1=1 and X2=1) are outputted and a transition is made to state 1.

The data thus coded has a superior random error correction performance. For example, highly reliable data can be obtained by using Viterbi decoding for deciding the most probable path and converting the coded data to decoded data.

A more specific example of Viterbi decoding is described with reference to FIG. 3 and FIG. 4.

When the state of the coding apparatus 1 is in the state of 0 (a=b=0) as an initial value, information bits are taken as being inputted to the encoding device 1 in the order of (0, 1, 0, 0). Directly after this, data (0, 0) signifying the end of the input data is inputted to the coding apparatus 1. Namely, in this case, data is inputted to the coding apparatus 1 in the order of (0, 1, 0, 0, 0, 0) and the coded data (00, 11, 10, 11, 00, 00) is outputted for this input.

Suppose that errors occur at the second and fifth bits with regards to this coded data, with the result that data (01, 11, 00, 11, 00, 00) is transmitted.

FIG. 3 shows a trellis line diagram up to the third block of this data.

In the Viterbi decoding, when (01) is transmitted at the first clock in (stage 0, state 0), a path metric is calculated after obtaining a branch metric showing a degree of probable transition to (stage 1, state 0) or (stage 1, state 1) to which transition is possible from this (stage 0, state 0). More specifically, these processes are carried out by calculating Hamming distances showing the sum of the differences in comparing the code word in every path ((00) and (11)) and the actual code word (01) for each of the components.

In this case, the branch metric for the path from (stage 0, state 0) to (stage 1, state 0) is 1 because the Hamming distance is 1 (because the comparison of the code word (00) and the actual code word (01) shows no difference for the first bit and the difference of 1 for the second bit, then 0+1=1). Similarly, a branch metric obtained for the path from (stage 0, state 0) to (stage 1, state 1) becomes 1 (=1+0). This and that the path metric for (stage 0, state 0) is also 0 make the path metrics for both (stage 1, state 0) and (stage 1, state 1) as being 1 (=0+1).

Next, when (11) is transmitted at the second clock, a path metric is obtained which is for the transition from each of the states ((stage 1, state 0) and (stage 1, state 1)) to states to which transitions are possible. That is because the branch metric from (stage 1, state 0) to (stage 2, state 0) is 2 (=1+1) and the path metric for (stage 1, state 0) is therefore 1, the path metric for (stage 2, state 0) is 3 (=1+2). The path metrics for (stage 2, state 1), (stage 2, state 2) and (stage 2, state 3) are therefore 1, 2 and 2.

Next, when (00) is transmitted at the third clock, a path metric is obtained for each of the states of the third stage but transitions from two states can be considered at each of the states of the third stage. In this case, a path having a smaller path metric is made to be selected. For example, at (stage 3, state 0), paths from (stage 2, state 0) and from (stage 2, state 2) exist. However, a path metric calculation about the path from (stage 2, state 0) gives 3 and a path metric obtained about the path from (stage 2, state 2) becomes 4. The path from (stage 2, state 0) is therefore selected as the survivor sequence.

Thus obtained survivor sequences with respect to code words up to the sixth clock are shown in FIG. 4.

In FIG. 4, two paths (00, 00, 00, 00, 00, 00) and (00, 11, 10, 11, 00, 00) are shown as survivor sequences (the final state always becomes 0 because (0,0) indicating the end of the data is given as the input data). Here, Hamming distances are then obtained for each of the code string of these two paths and the actual code string, with the smaller one of these paths being selected. Namely, (00, 11, 10, 11, 00, 00) is selected as the final survivor sequence because the Hamming distance for (00, 00, 00, 00, 00, 00) and (01, 11, 00, 11, 00, 00) is 5 and the Hamming distance for (00, 11, 10, 11, 00, 00) and (01, 11, 00, 11, 00, 00) is 2. The code string is the same as the output data of the coding apparatus 1 and is a code string with errors being removed.

In this way, errors included in transmitted coded data can be corrected.

For actually carrying out Viterbi decoding, such a path memory is necessary as that for storing survivor sequences having a configuration corresponding to, for example, the trellis line diagram shown in FIG. 2.

In the aforementioned example, a description was given of the case of a short code string (00, 11, 10, 11, 00, 00), but code strings are generally quite long. Therefore, when Viterbi decoding is exactly carried out it is necessary to store survivor sequences up until the end of the code string. However, in this case, the number of memory cells increases tremendously and the delay time for decoding also becomes excessive. Then, the newest path of a prescribed length is usually stored in the path memory, and the decode word data occurring at the time of inputting the oldest path is decided upon and outputted directly before writing a new path and the oldest path is then discarded.

Further, there are two decoding methods for carrying out Viterbi decoding using survivor path information stored in the path memory, the traceback method (see Japanese Laid-Open Patent Publication 62-23933) and the RE (Register Exchange) method (see IEEE Transactions on Communications, vol. 41, No. 3 (March, 1993)). The RE method consumes larger power when compared with the traceback method, but has higher decoding speed. The RE method is therefore used in order to carry out decoding at high speeds.

However, in the case of convolution coded data of a constraint length of 7, the number of states becomes as much as 64 and a large number of gates is necessary for path memory using the RE method. As a result, the power consumed in CMOS LSIs comprising the gates therefore becomes large and the resulting heat generation becomes excessive. This causes a problem that the CMOS LSIs cannot be put into a plastic package when an attempt is made to fabricate the path memory as an IC.

Then, it can be considered to use the less power consuming form of traceback by making its decoding speed high. For example, the RAM for storing the survivor sequences can be partitioned into a plurality of memory banks for carrying out the writing of survivor sequence information and decoding (reading out) using traceback in parallel with separate memory banks.

However, even in this case, the decoding speed is not sufficient and it is difficult to achieve higher-speed decoding using the traceback method.

As the present invention sets out to resolve the aforementioned problems, it is the object of the present invention to realize a Viterbi decoding device that carries out decoding at a high speed by carrying out an interleave operation with respect to two RAMs.

SUMMARY OF THE INVENTION

In order to achieve the above object, the present invention provides a Viterbi decoding apparatus for generating maximum likelihood decoded data as a result of analyzing survivor sequences information stored in a memory unit by carrying out traceback, which apparatus comprises a clock generator, a first memory, a second memory, and a reading out device.

The clock generator is for generating the first clock and the second clock with a phase inverse of that of the first clock. The first clock and the second clock can be delayed by half a period thereof when the traceback is started. The clock generator may comprise a mask signal generator and a frequency divider. The mask signal generator is for generating a mask signal in accordance with a starting signal indicating start of the traceback and the master clock, and the frequency divider is for dividing the frequency of the master clock inputted together with the mask signal in half and delaying the first clock and the second clock by half a period thereof in accordance with the mask signal.

The first memory is for memorizing half of the survivor sequences information in accordance with the first clock and the second memory is for memorizing half of the survivor sequences information in accordance with the second clock. The first memory and the second memory can carry out memorizing and reading out the survivor sequences information in the same address in accordance with the first clock and the second clock, and can be composed of memories being divided into prescribed number of memory banks.

The reading out device is for reading out the survivor sequences information memorized in the first memory and the second memory in a prescribed order in accordance with the first clock and the second clock, respectively.

The Viterbi decoding apparatus may further comprise a selector for selecting one of the survivor sequences information inputted from the first memory and the second memory so as to output the selected one in accordance with a switching control signal. The switching control signal, together with the first clock and the second clock, is a signal in synchronism with a master clock.

In addition, the Viterbi decoding apparatus further comprises a branch metrics calculating circuit and an Add Compare Select device.

The branch metrics calculating circuit is for carrying out calculation of branch metrics for two paths to states to which transitions are possible from a state, with the calculation being carried out for all states being determined by constraint lengths. The Add Compare Select device is for carrying out, with respect to each of the two paths, addition of the branch metric outputted from the branch metrics calculating circuit and a path metric of a state from which a transition has been made, and for carrying out selection of a smaller metric presented as a smaller one of the results of the addition, and the result of the selection is memorized in the first memory or the second memory.

The present invention also provides a method of carrying out Viterbi decoding for generating maximum likelihood decoded data as a result of analyzing survivor sequences information stored in a memory unit by carrying out traceback, which method comprises the steps of generating the first clock and the second clock having a phase inverse of that of the first clock, memorizing half of the survivor sequences information in the first memory in accordance with the first clock, memorizing half of the survivor sequences information in the second memory in accordance with the second clock, and reading out the survivor sequences information memorized in the first memory and the second memory in a prescribed order in accordance with the first clock and the second clock, respectively.

The first clock and the second clock can be delayed by half a period thereof when the traceback is started.

The steps of memorizing and reading out the survivor sequences information in the first memory an the second memory means can be carried out in the same address in accordance with the first clock and the second clock.

The method may further comprise the step of selecting one of the survivor sequences information read out from the first memory and the second memory for being outputted.

Moreover, the method may further comprise the steps of carrying out calculation of branch metrics for two paths to states to which transitions are possible from a state, with the calculation being carried out all of states being determined by constraint lengths, carrying out with respect to each of the two paths addition of the branch metric outputted from the branch metrics calculating means and a path metric of a state from which a transition has been made, carrying out selection of a smaller metric presented as a smaller one of the results of the addition, and memorizing the result of the selection in the first memory or the second memory.

BRIEF DESCRIPTION OF THE DRAWINGS

FIGS. 11A through 11H are signal waveforms composing a timing chart when the clock CK1 and the clock CK2 generated by an in-half frequency dividing circuit are supplied to the RAM 61-1 and the RAM 61-2 in the path memory shown in FIG. 8;

FIGS. 16A through 16G signal waveforms composing a timing chart for the case where the clock mask M an the master clock CK are supplied to the frequency dividing circuit; and FIGS. 17A through 17I are signal waveforms composing a timing chart of the case where the output of the dividing circuit is supplied to the RAM 61-1 and the RAM 61-2.

DETAILED DESCRIPTION OF THE PREFERRED EMBODIMENTS

The following is a description of an embodiment of the present invention.

Figure 5:
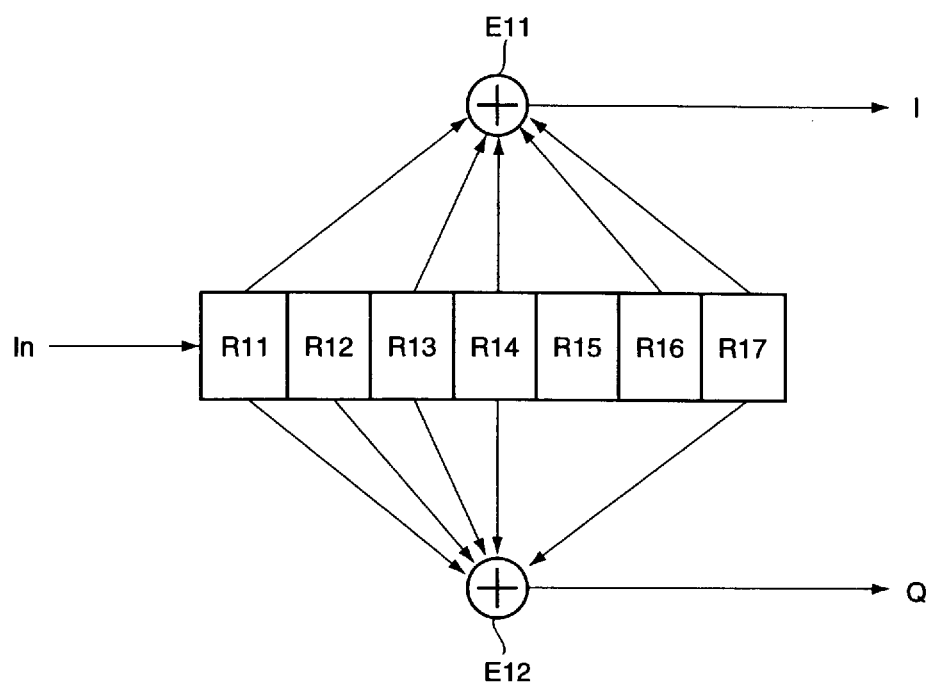
FIG. 5 is a view showing an example of a configuration of coding apparatus for carrying out convolutional coding at a constraint length of 7 and a coding rate of ½.

FIG. 5 shows an example of a configuration of a coding apparatus 11 for convolutional coding of constraint length 7 and of a coding rate of ½.

The coding apparatus 11 comprises a seven-bit shift register comprised of registers R11 to R17 and two exclusive OR circuits (exclusive OR circuit E11 and exclusive OR circuit E12).

The exclusive OR circuit E11 performs an exclusive OR operation on the information bits for the registers R11, R13, R14, R16 and R17 and outputs the result as a binary signal value I. The exclusive OR circuit E12 performs an exclusive OR operation on the information bits for register R11 to R14 and register R17 and outputs the result as the binary signal value Q.

When one bit of information is inputted at the register R11, the information bit accumulated at the register R11 is shifted to the register R12. The information bits accumulated at the registers R12 to R16 are also shifted to registers R13 to R17, respectively.

The values I and Q are also inputted to QPSK (Quadrature Phase Shift Keying) modulation circuits (not shown in the drawings).

Figure 6:
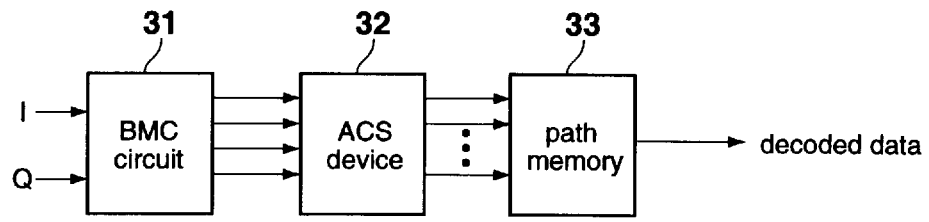
FIG. 6 is a block diagram showing a configuration of an embodiment of the Viterbi decoding apparatus of the present invention.

FIG. 6 is a block diagram showing a configuration of an embodiment of the Viterbi decoding apparatus 21 of the present invention for decoding data coded at the coding apparatus 11 of FIG. 5.

The channel signal of value I and the channel signal of value Q transmitted from the QPSK modulating circuit are inputted to a BMC circuit 31 of the Viterbi decoding apparatus 21.

The BMC circuit 31 calculates branch metrics of paths, through which transitions from the one clock preceding states to the current states are possible, for all 64 types of states (=2^(7−1)) and outputs them to an ACS (Add Compare Select) device 32.

The ACS device 32 has 64 built-in ACS circuits (41-0 to 41-63) corresponding to all of the 64 types of states. In each of the ACS circuit, a current path metric of a path from a one clock preceding state is obtained as a sum of a branch metric from the preceding state inputted from the BMC circuit 31 and a path metric of the preceding state. Of the obtained current path metrics, the smaller one is selected as the current state path metric. The selected current state path metric for each state is outputted to the path memory 33.

The path memory 33 stores information for the 64 survivor sequences inputted from the ACS device 32 in memory cells corresponding to each state, reads out stored information of the survivor sequences by tracing back from the new information to the old information, and outputs decoded data. Writing of the survivor sequence information and reading out of the survivor sequence information by traceback are performed by an interleave operation using the two RAMs composing the path memory 33.

Figure 7:
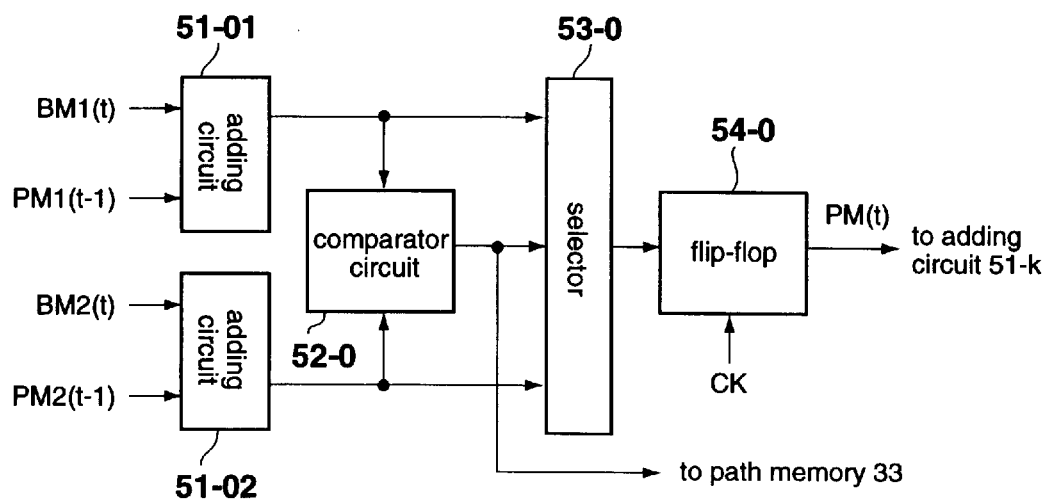
FIG. 7 is a block diagram showing a configuration of an embodiment of an ACS circuit built-into the ACS device.

FIG. 7 is a block diagram showing a configuration of an embodiment of an ACS circuit 41-0 built-into the ACS device 32. Although not shown in the drawings, other ACS circuits (41-1 to 41-63) also have the same configuration.

An adding circuit 51-01 adds a branch metric BM1 (t) inputted from the BMC circuit 31 as a branch metric from a certain state capable of making a transition to the state corresponding to the ACS circuit 41-0 of the states occurring at a time (t-1), and a path metric PM1 (t-1) inputted from a flip-flop 54-L in an ACS circuit 41-L corresponding to the above certain state occurring at the time (t-1). The resulting sum is outputted to a comparator circuit 52-0 and a selector 53-0.

An adding circuit 51-02 adds a branch metric BM 2(t) from a certain different state capable of making a transition to the state corresponding to the ACS circuit 41-0 of the states occurring at the time (t-1) and a path metric PM2 (t-1) of the above certain different state occurring at the time (t-1) and outputs the results to the comparator circuit 52-0 and the selector 53-0.

The comparator circuit 52-0 compares the values of the metrics respectively inputted from the adder circuits 51-01 and the adder circuit 51-02 and outputs the comparison results to the selector 53-0. The comparator circuit 52-0 also outputs the comparison result to the corresponding memory cells in the path memory 33 as survivor sequence information (Din of FIG. 8 shown later).

The selector 53-0 selects smaller path metric of the path metrics inputted from the adder circuit 51-01 and the adder circuit 51-02 on the basis of the comparison result in the comparator circuit 52-0 and outputs the selected path metric to the flip-flop 54-0.

The flip-flop 54-0 then outputs the path metric PM(t) in accordance with the master clock CK to an adder circuit 51-ki (i=1 or 2) of another ACS circuit 41-k corresponding a state to which a transition is possible at a prescribed timing (a timing delayed by one clock from the master clock CK).

Figure 8:
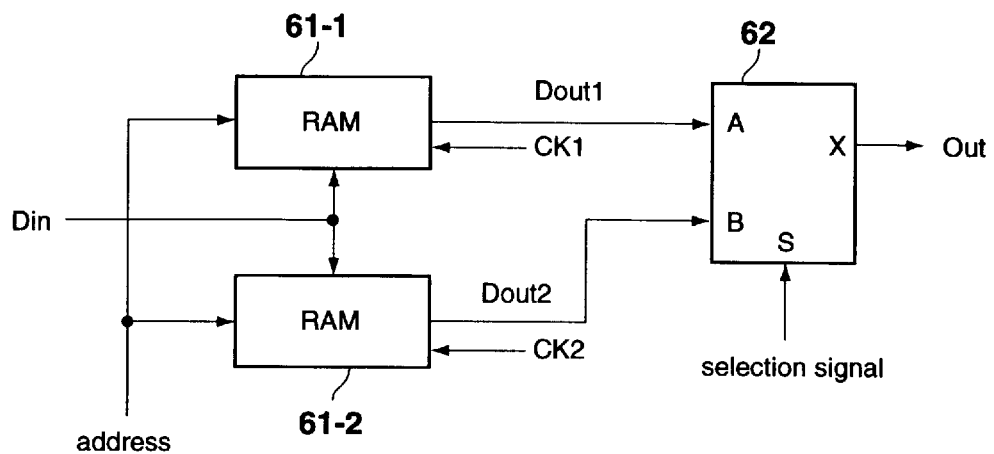
FIG. 8 is a block diagram showing a configuration of an embodiment of a path memory.

FIG. 8 is a block diagram showing the configuration of an embodiment of the path memory 33.

Information for the survivor sequence inputted from the ACS circuit 32 (comparator circuits (52-0 to 52-63)) and shown by Din in the drawing is supplied to the RAM 61-1 and the RAM 61-2 in synchronization with the master clock. Further, a common signal is provided as the address signal indicating the position in the RAM 61-1 and the RAM 61-2 for writing to an reading. Survivor sequence information data corresponding to 64 states (a total of 64 bits of data) is supplied in synchronization with the master clock from the ACS device 32 to memory cells each corresponding to each of the states in the RAMs 61-1 to 61-2 but in this drawing the data has been taken collectively to be an input Din shown as being supplied in a form of one line.

The RAM 61-1 and the RAM 61-2 are partitioned into six memory banks. The process of writing the information for the survivor sequences and the process of reading by traceback are then carried out in parallel using separate memory banks in synchronization with clock CK1 and clock CK2 of frequencies of half of the master clock (this is described in the following with reference to FIG. 9).

The clocks CK1 and CK2 supplied to the RAMs 61-1 and 61-2 are clocks whose phases are different from each other by half a period. The write process and the read process by traceback for the input Din (survivor sequence information) are then carried out alternately at the memory banks corresponding each other in the RAM 61-1 and the RAM 61-2 so that both write and read process are interleaved.

Survivor sequence information read-out by traceback is inputted to the terminal A and the terminal B of the selector 62 respectively on a prescribed timing. The selector 62 then selects one of the data inputted to the terminals A and B in accordance with a select signal inputted to a terminal S and outputs the selected data via the terminal X. The select signal is in synchronization with the master clock for alternately selecting the data read out from a memory bank in the RAM 61-1 (data inputted to the terminal A) and data read out from the corresponding memory bank in the RAM 61-2 (data inputted to the terminal B). The selector 62 then outputs the data in an appropriate sequence by selecting the input data in accordance with the select signal.

Figure 9:
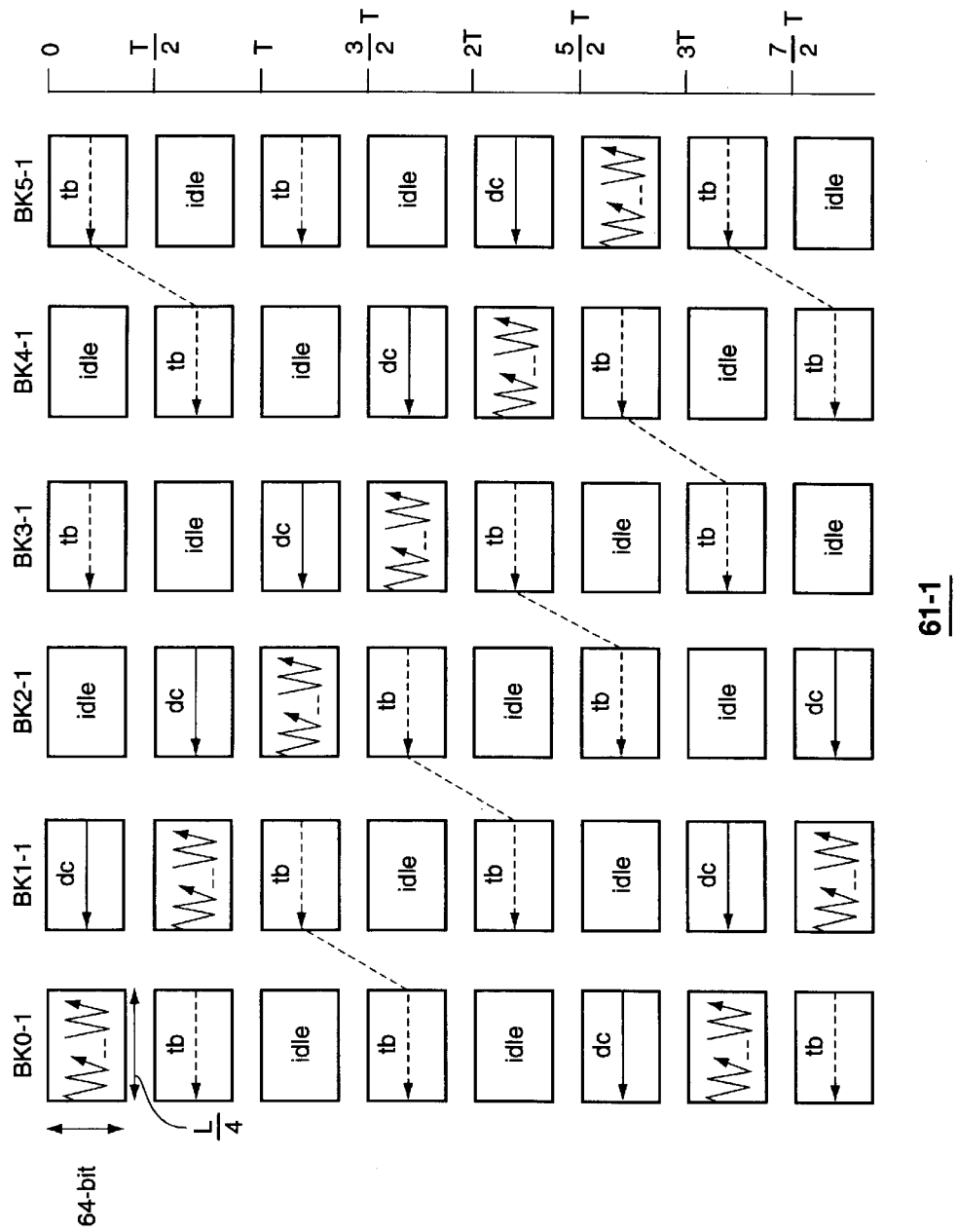
FIG. 9 is a view illustrating the memory banks composing RAM 61-1 and how the states of these memory banks change with respect to time.

FIG. 9 is a view showing the memory banks composing the RAM 61-1 and the changes in states of the memory bank with time. Although not shown in the drawings, the RAM 61-2 also has the same configuration as the RAM 61-1. The memory bank shown in FIG. 9 is configured with reference to Transaction Letters "Architectural Tradeoffs for Survivor Sequence Memory Management in Viterbi Decoders" (Gennady Feygin and P. G. Guiak, IEEE Transactions on Communications, vol. 41, No. 3, P426 (March 1993)).

As shown in FIG. 9, the RAM 61-1 comprises 6 memory banks (BK0-1 to BK5-1). Each memory bank has a capacity specified by a width corresponding to the number of states 64 (64 bit) and a size a quarter of the number of stages for carrying out traceback (traceback depth L) with half-word length of 16 bit. That is, at the path memory 33, as described later, Viterbi decoding is carried out using survivor sequence information written in 12 memory banks (the six memory banks of RAM 61-1 and the six memory banks corresponding to the RAM 61-2).

The six memory banks (BK0-1 to BK5-1) positioned at the top of FIG. 9 show the states of each memory bank composing the RAM 61-1 at time 0. That is, the memory bank BK0-1 shows that the write process for the survivor sequence information starts from the time 0 and the memory bank BK1-1 shows that the decode process (dc) for the data on the survivor sequence stored in the memory bank of the traced-back data starts at the time 0.

The memory bank BK2-1 and the memory bank BK4-1 are shown to be in non-operating states, i.e. states where neither the write process for the survivor sequence, traceback (read-out process) nor decode processing is being carried out (idle) are shown, with the memory bank BK 3-1 and the memory bank 5-1 showing that tracebacks (tb) starts from a time 0.

Let the time necessary to write the survivor sequence information up to the range shown by the track-back depth L be expressed by the period T. Since writing of the survivor sequence is carried out to the RAM 61-1 and the RAM 61-2 alternately, the six memory banks on the second row down from the top of FIG. 9 showing changes in the states of the RAM 61-1 therefore show states when a half-period (T/2) has elapsed from the states for the six memory banks shown on the first row. Similarly, the six memory banks shown on the third to the eighth rows from the top of FIG. 9 show states where T, (3T)/2, 2T, (5T)/2, 3T and (7T) have respectively elapsed from the states for the six memory banks shown at the first row from the top.

Each of the memory banks (BK0-1 to BK5-1) then repeatedly carry out processing every half period (T/2) in the order of writing survivor sequence information, traceback (tb), wait state (idle), traceback (tb), wait state (idle) and decode (dc).

As becomes clear from this drawing, changes in the process with respect to time regarding the two memory banks BK0-1 and BK1-1, for example, are followed as below. At a time 0, writing of survivor sequence information supplied from the ACS device 32 starts in the order of the memory bank BK0-1 and BK1-1 with writing being completed at a time T. At the same time, traceback starts and survivor sequence information is read-out in the order of memory bank BK1-1 and BK0-1 and is then outputted. At a time 2T, traceback ends, and data on the survivor sequence stored at the memory bank BK0-1 is decoded at a time (5T)/2.

At a time (3T)/2, writing to the memory bank BK2-1 is completed. Traceback is then carried out in the order of memory bank BK2-1 and BK1-1 and decoding is carried out at a time 3T.

In this way, writing and traceback or decoding of survivor sequence information are repeatedly executed in order for four of the six memory banks (the two change in sequence).

These operations are, of course, carried out alternately for RAM 61-1 and RAM 61-2 in accordance with clock CK1 and clock CK2. Therefore, in reality, at time 0, writing of survivor sequence information supplied by the ACS device 32 is started for the two memory banks (memory bank BK0-1 of RAM 61-1 and memory bank BK0-2 of RAM 61-2), with writing being completed at a time T. Traceback then starts and survivor sequence information is read out and outputted in the appropriate order via the selector 62. Traceback then ends at a time 2T. Then, at a time (5T)/2, data on the survivor sequences stored in memory bank BK0-1 of the RAM 61-1 and memory bank BK0-2 of RAM 61-2 is outputted.

These operations (write and read out operations) are carried out in parallel within the two groups of six memory banks of the RAM 61-1 and RAM 61-2, so that Viterbi decoding can be carried out at a high speed. In the above embodiment each of the RAM 61-1 and the RAM 61-2 is divided into 6 memory banks. However, the RAM can also be comprised of memory banks whose number is multiple of two so that Viterbi decoding can be carried out on the basis of survivor sequence information stored in two memory banks of one RAM.

Thus, the aforementioned operation can be carried out alternately at RAM 61-1 and RAM 61-2, Viterbi decoding can be therefore carried out at twice the speed compared with, for example, the case where the operation shown in FIG. 9 is carried out using a single RAM.

However, as shown in FIG. 9, traceback is executed in this Viterbi decoding directly after completion of the writing of the traceback depth L. Therefore, when clock CK1 and clock CK2 are generated from the master clock using a normal D flip-flop, the sequence of reading the data is reversed at the time when writing is shifted to reading. This is described with reference to FIG. 10 and FIG. 11.

Figure 10:
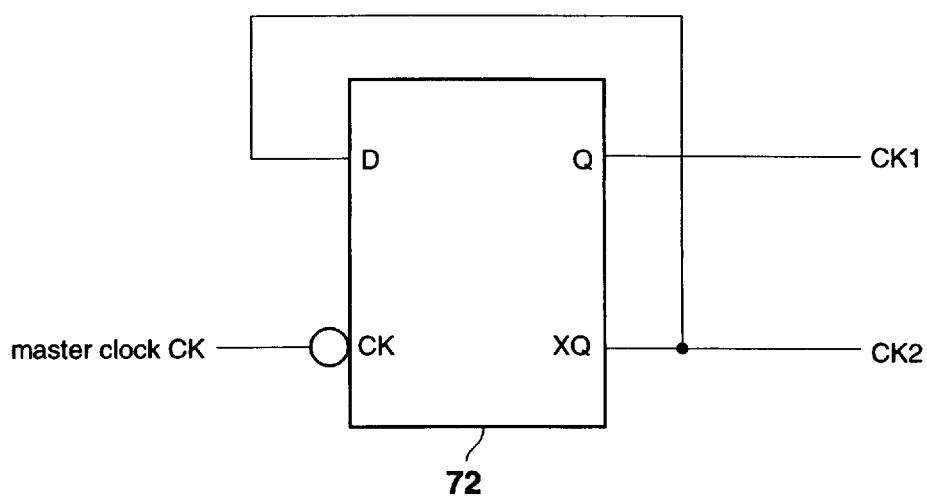
FIG. 10 is a view showing a configuration of an example of a half-dividing circuit.

For example, let the clocks be generated from the master clock to have a half the frequency thereof by an in-half frequency dividing circuit 71 of the configuration shown in FIG. 10.

At the in-half frequency dividing circuit 71 shown in FIG. 10, a master clock CK is inputted to the terminal CK of the D flip-flop 72 and the output of terminal XQ is inputted to terminal D. The output of terminal Q is then outputted as the clock CK1 and the output of terminal XQ is outputted as the clock CK2.

Figure 4:
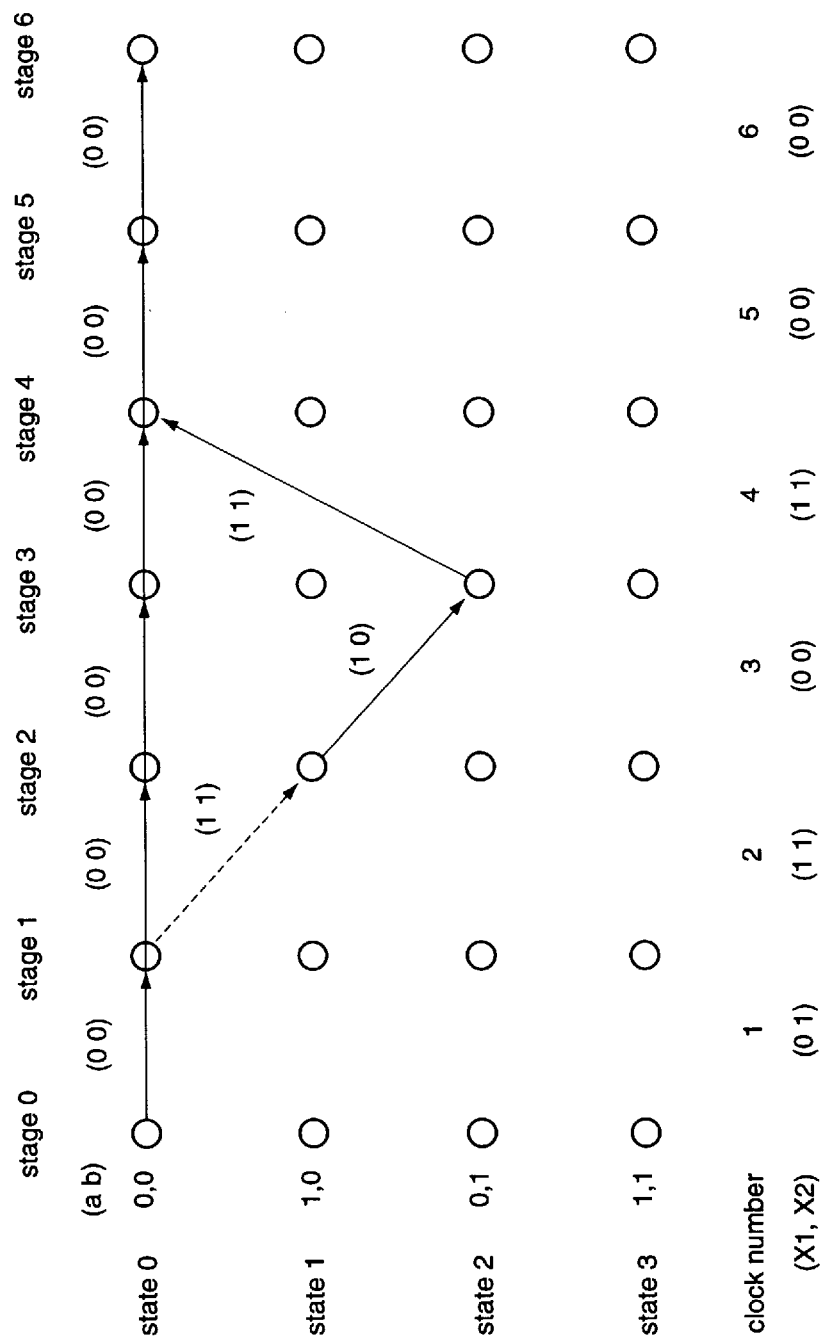
FIG. 4 is the second diagram illustrating the principle of the Viterbi decoding by using the trellis line diagram in FIG. 2.

The operation for the case where the clocks CK1 and CK2 generated using the in-half frequency dividing circuit 71 shown in FIG. 10 are supplied to the RAM 61-1 and the RAM 61-2 of the path memory 33 of FIG. 4 is described with reference to the timing chart composed of signal waveforms shown as FIGS. 11A through 11H.

The input Din taken as the information for the survivor sequence is originally input data having 64 bits, but in FIG. 11, this is shown as being the data (N-5) to N of one bit to simplify the description.

When the master clock CK (FIG. 11A) is supplied to the terminal CK of the in-half frequency dividing circuit 71, the logic of the signal of the terminal D (XQ) at the timing of the falling edge of the master clock is latched and is outputted by terminal Q, with a signal of a logic level opposite to that from the terminal Q being outputted from the terminal XQ. In this way, a clock CK1 (FIG. 11B) of half the frequency of the master clock CK is outputted from the terminal Q. The clock CK2 (FIG. 11C) of a phase differing by half a period at a time (inverse phase) to the phase of the clock CK1 (FIG. 11B) is then outputted by the terminal XQ of the half-dividing circuit 71. The clock CK1 and the clock CK2 generated in this way are then supplied to RAM 61-1 and RAM 61-2 of FIG. 8, respectively.

Figure 1:
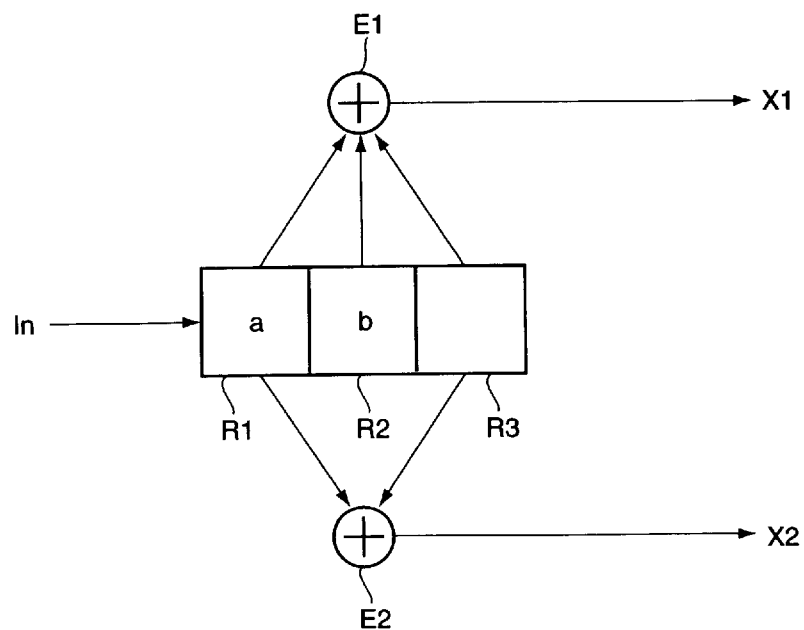
FIG. 1 is a view showing a configuration of an example of a coding apparatus for carrying out convolutional coding at a constraint length of 3 and coding rate of ½.
Figure 2:
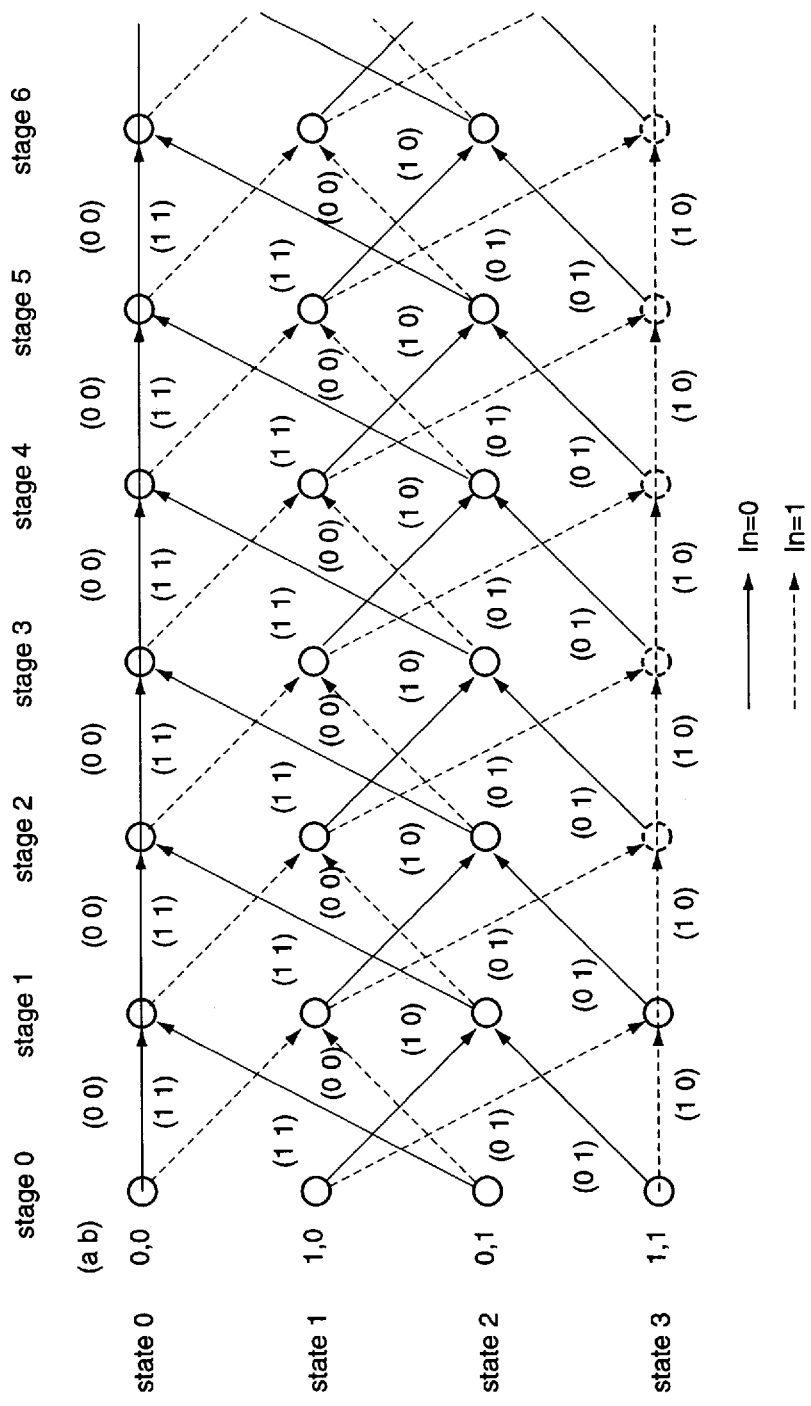
FIG. 2 is a trellis line diagram corresponding to the coding apparatus of FIG. 1.
Figure 3:
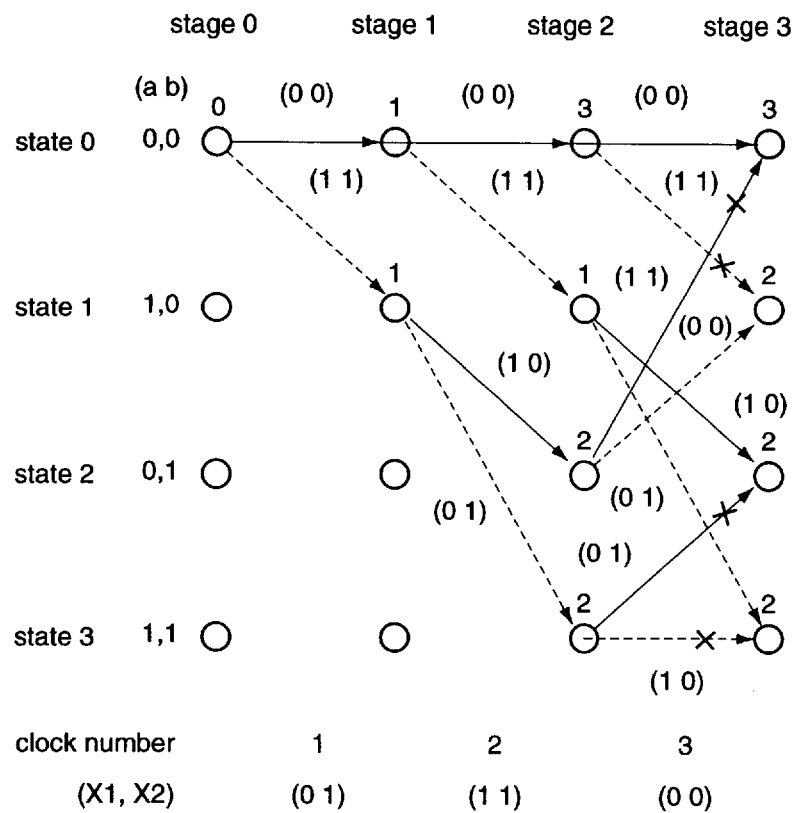
FIG. 3 is the first diagram illustrating the principle of the Viterbi decoding by using the trellis line diagram in FIG. 2.

When a signal XWE (FIG. 1E) is an L (low) level signal (write mode), the input Din (FIG. 11D) supplied in synchronization with the master clock CK (FIG. 11A) is written to the memory cells corresponding to the address signals AD (FIG. 11H) at the RAM 61-1 in the order of the data (N-5), (N-3) and (N-1) at the timing of the falling edges of the clock CK1 (FIG. 11B) while at the same time being read-out as the output Dout1 (FIG. 11F).

Similarly, when the signal XWE is an L (Low) level signal, at the RAM 61-2, the input Din (FIG. 1D) supplied in synchronization with the master clock CK (FIG. 11A) is written to the memory cells corresponding to the address signals AD (FIG. 11H) at the timing of the falling edges of the clock CK2 (FIG. 11C) in the order of the data (N-4), (N-2) and N while at the same time being read-out as the output Dout2 (FIG. 11G).

When the signal XWE (FIG. 11E) is an H (High) level signal (read mode), the RAM 61-1 reads out data written to the memory cells corresponding to the address signals AD (FIG. 11H) at the timing of the falling edge of the clock CKI (FIG. 11B) in the order of the data (N-1), (N-3), (N-5) as the output Dout1 (FIG. 11F).

Similarly, when the signal XWE is an H (High) level signal, the RAM 61-2 reads out data written to the memory cells corresponding to the address signal AD (FIG. 11H) at the timing of the falling edge of the clock CK2 (FIG. 7(C)) in the order of the data N, (N-2), (N-4) as the output Dout2 (FIG. 11G). These outputs Dout1 and Dout2 are inputted to the selector 62 in FIG. 8 and outputted alternately at a prescribed timing as the output signal Out.

In this way, data Dout1 (FIG. 11F) and data Dout2 (FIG. 11G) are respectively read out from the RAM 61-1 and the RAM 61-2 in synchronization with the clock CKI (FIG. 11B) and the clock CK2 (FIG. 11C) generated from the master clock CK (FIG. 11A). These data are then selected alternately by the selector 62 with the order of data (N-1), data N, data (N-3), data (N-2) and data (N-5), which is out of the original order of data N, data (N-1), data (N-2), data (N-3), data (N-4) and data (N-5).

In traceback, one bit is selected from the 64-bit of data to be read out and this one bit of data and the address (state) thereof are used to decide one clock preceding state. Therefore, if the sequence of reading out the data is not appropriate, Viterbi decoding cannot be carried out.

For this reason, in this embodiment, a clock mask with a duration equivalent to one period of the master clock is generated at the time of switching over from writing to reading, with this clock mask then being utilized to delay the phases of the clock CK1 and the clock CK2 by half a period.

Figure 12:
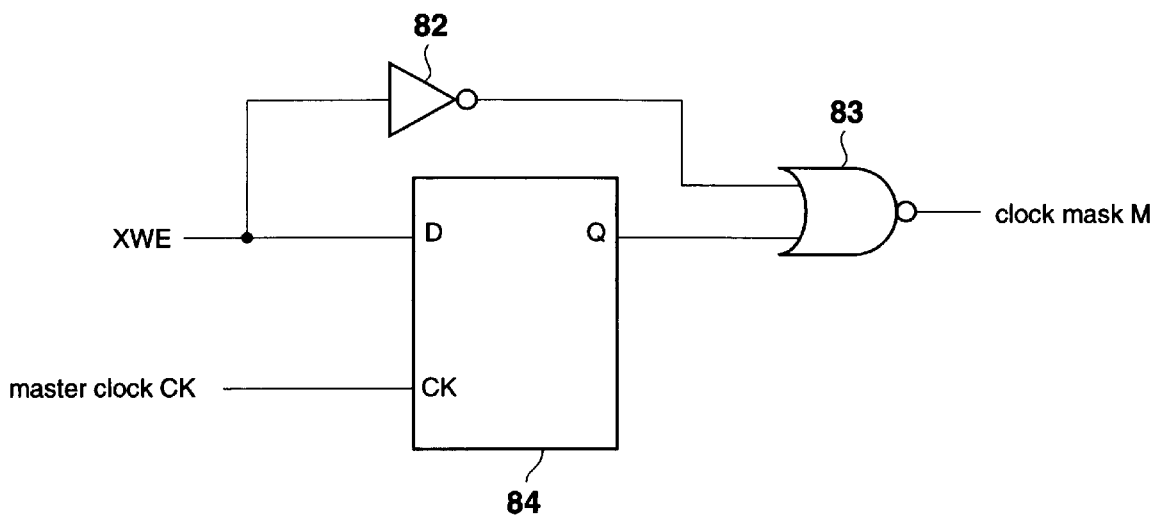
FIG. 12 is a view showing a configuration of an embodiment of the clock mask generator circuit for generating the clock mask signal.

FIG. 12 is a view showing an embodiment of a clock mask generating circuit 81 for generating a clock mask with a duration equivalent to one period of the master clock at the time of switching from writing to reading.

The master clock CK is inputted to the terminal CK of a D flip-flop 84, the signal XWE is inputted to the terminal D and the output of the terminal Q is supplied to one of the input terminals of a NOR circuit 83. The signal XWE is also supplied to the remaining input terminal of the NOR circuit 83 after being inverted at a NOT circuit 82. The output of the NOR circuit 83 is then outputted as a clock mask M.

The operation of the clock mask generating circuit 81 will now be described with reference to the timing chart composed of signal waveforms shown as FIGS. 13A through 13E.

Figure 13:
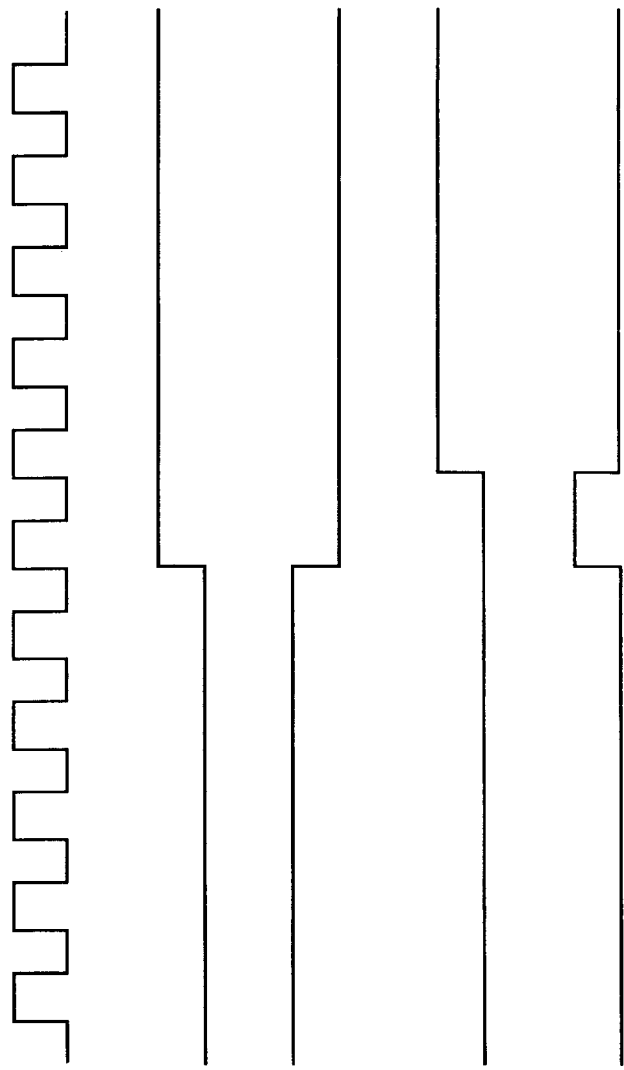
FIGS. 13A through 13E are signal waveforms composing a timing chart for the clock mask generated by the clock mask generator circuit shown in FIG. 12.

The signal XWE (FIG. 13B) is inverted by the NOT circuit 82, whose output signal (FIG. 14C) is inputted to the NOR circuit 83. While, a D flip-flop 84 outputs a signal (FIG. 13D) corresponding to the level of the signal XWE (FIG. 13B) occurring at the timing of the rising edge of the master clock CK (FIG. 13A). The NOR circuit 83 then performs a NOR operation on the output signal of the NOT circuit 82 (FIG. 13C) and the output signal of the D-type flip-flop 84 (FIG. 13D) and outputs the result of the NOR operation as a clock mask M (FIG. 13E).

As can be understood from FIGS. 13B and 13E, this clock mask M (FIG. 13E) is generated when the operation is switched from write to read out as a signal with a duration equivalent to one period of the master clock CK (FIG. 13A).

Figure 14:
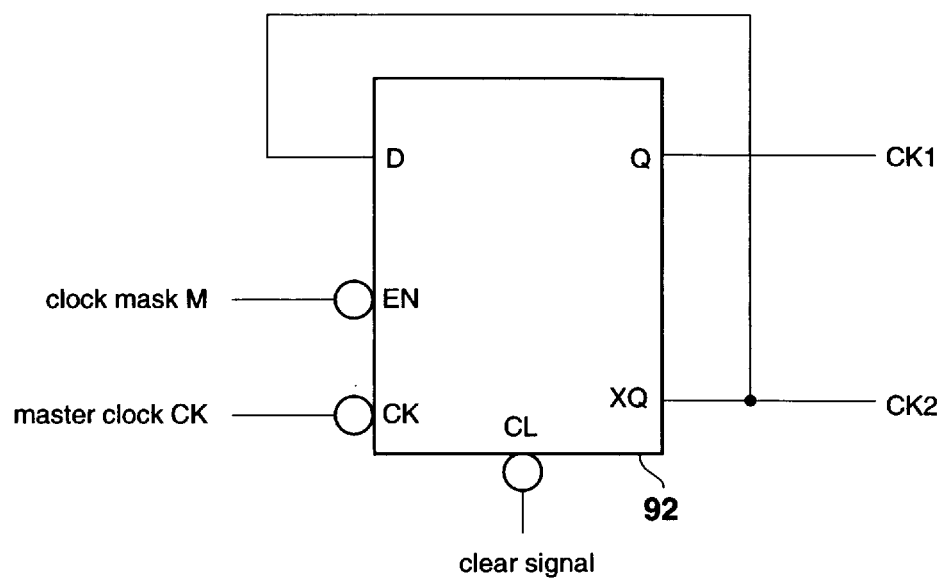
FIG. 14 is a view showing a configuration of an embodiment of the frequency dividing circuit.

FIG. 14 shows a frequency dividing circuit which shifts both the phases of clock CK1 and clock CK2 by half a period at the time of switching the operation from writing to reading by utilizing this clock mask M.

A flip-flop 92 with an enable terminal EN shown in FIG. 14 delays both the phases of the clock CK1 and the clock CK2 by half a period by applying the clock mask M to the terminal EN as a disable signal at the time of switching the operation from writing to reading.

Figure 15:
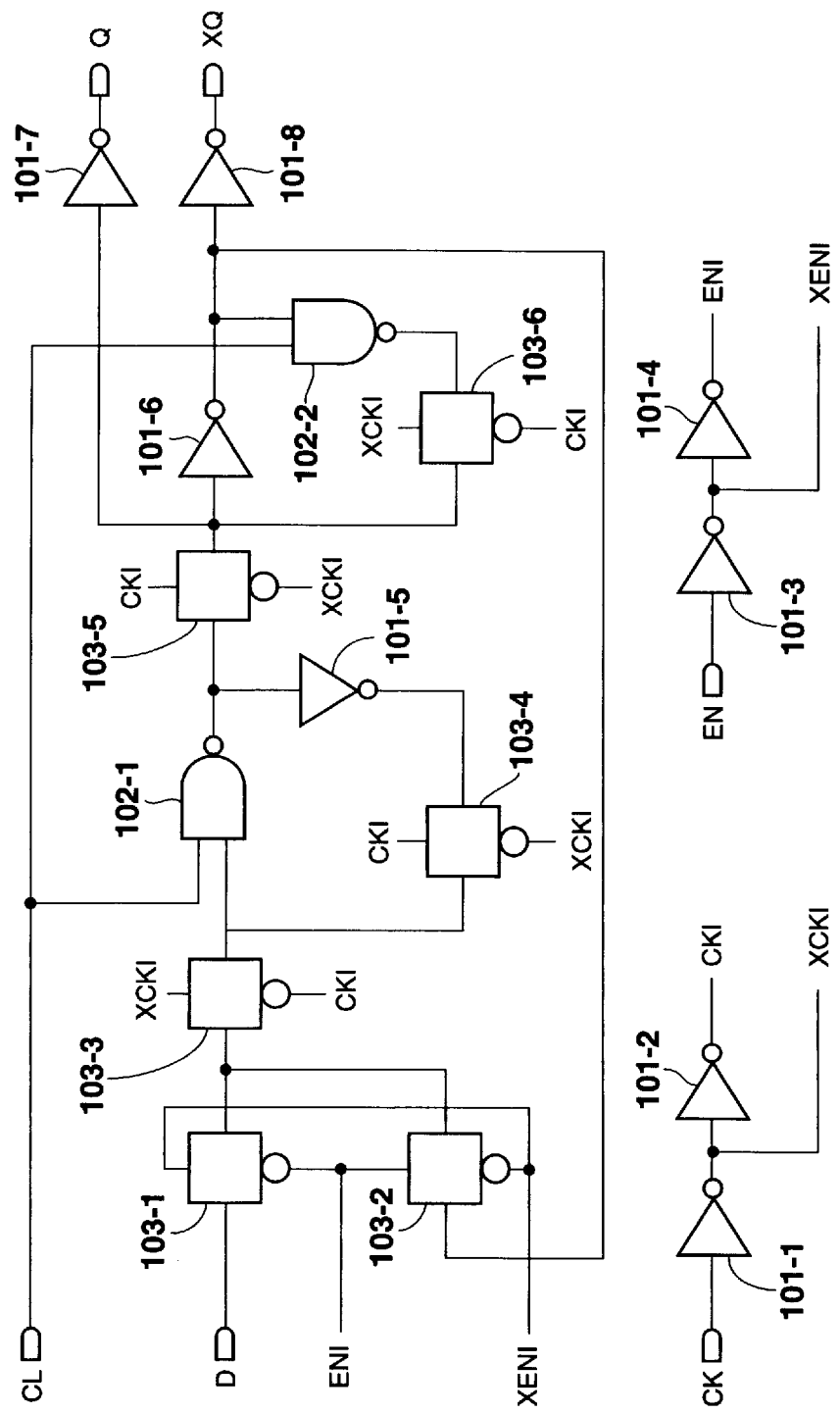
FIG. 15 is a logic circuit diagram showing a configuration of an embodiment of the flip-flop with EN terminal.

FIG. 15 is a circuit diagram showing the configuration of an embodiment of the flip-flop 92 with an EN terminal.

The flip-flop 92 with the EN terminal has four input terminals, a clear terminal CL, a D terminal, a CK terminal and an EN terminal, and has two output terminals, a Q terminal and an XQ terminal, as shown in FIG. 14.

The master clock CK inputted from input terminal CK is supplied to NOT circuit 101-1 and inverted, with this output then being outputted as a clock XCKI, as well as being supplied to the NOT circuit 101-2 which outputs further inverted signal as a clock CKI having the same waveform as the master clock CK.

The clock mask M inputted from the input terminal EN is supplied to the NOT circuit 101-3 and inverted, with this output then being outputted as a clock mask XENI as well as being provided to a NOT circuit 101-4 to be further inverted and outputted as a clock mask ENI having the same waveform as the clock mask M.

The clock CKI is supplied to the negative terminal of the switch 103-3, the positive terminal of the switch 103-4, the positive terminal of the switch 103-5 and the negative terminal of the switch 103-6. The clock XCKI is supplied to the positive terminal of the switch 103-3, the negative terminal of the switch 103-4, the negative terminal of the switch 103-5 and the positive terminal of the switch 103-6.

A clock mask ENI is supplied to the negative terminal of the switch 103-1 and the positive terminal of the switch 103-2, and a clock mask XENI is supplied to the positive terminal of the switch 103-1 and the negative terminal of the switch 103-2.

An input terminal D is connected to one of the input terminals of the NAND circuit 102-1 via the switch 103-1 and the switch 103-3. The input terminal CL is connected to the other input terminal of the NAND circuit 102-1 and one of the inputs terminal of the NAND circuit 102-1 and one of the input terminals of the NAND circuit 102-2.

The output terminal of the NAND circuit 102-1 is connected to the connection point of the switch 103-3 and the NAND circuit 102-1 via the NOT circuit 101-5 and the switch 103-4, as well as being connected to the input terminal of the NOT circuit 101-6 and the input terminal of the NOT circuit 101-7 via the switch 103-5.

The output terminal of the NOT circuit 101-6 is connected to the remaining input terminal of the NAND circuit 102-2 and the input terminal of the NOT circuit 101-8, as well as being connected to the connection point of the switch 103-1 and the switch 103-3 via the switch 103-2. The output of the NAND circuit 102-2 is connected to the connection point of the switch 103-5 and the NOT circuit 101-6 via switch 103-6.

The output terminal of the NOT circuit 101-7 is connected to the output terminal Q of the flip-flop 92 with an EN terminal and the output terminal of the NOT circuit 101-8 is connected to the output terminal XQ of the flip-flop 92 with an EN terminal.

The switches 103-1 to 103-6 are turned ON when an H (High) level signal is supplied to the positive terminal and an L (Low) level signal is supplied to the negative terminal, and are turned OFF when the opposite is the case. For example, when the signal CK1 is in H (High) level, the signal XCKI is in L (Low) level and at this time the switch 103-5 goes ON and the output of the NAND circuit 102-1 is inputted to the NOT circuit 101-6 and the NOT circuit 101-7.

At the flip-flop 92 with the EN terminal shown in FIG. 15, the switch 103-3 and the switch 103-6 go ON when the clock CK1 is in L level and switch 103-4 and the switch 103-5 go ON when the clock XCKI is in L level (when the clock CKI is in H level), i.e. the switches in these combinations are alternately turned ON every half-period of the clock CKI.

Therefore, when the switch 103-3 and the switch 103-6 are turned ON (when the clock CKI is in L level), the outputs from the output terminal Q and the output terminal XQ are decided by the output value of the NAND circuit 102-2. Further, when the switch 103-4 and the switch 103-5 are turned ON (when the clock CKI is in H level) the outputs from the output terminal Q and the output terminal XQ are decided by the output value of the NAND circuit 102-1.

At the frequency dividing circuit 91, the output from terminal XQ is inputted to the terminal D. This makes the output from the terminal XQ to be supplied to the NAND circuit 102-1 via the switch 103-3 being turned ON when the clock CKI is in L level. With respect to this arrangement, the switch 103-1 and 103-2 are provided for supplying a signal with an inverted form of the output signal from the terminal XQ from the point before the NOT circuit 101-8 to the NAND circuit 102-1 at the time of switching from the write process to the read out process. This allows both clock CK1 and clock CK2 to be delayed by half a period at the time of switching from the write process to the read out process.

The operation when the master clock CK and the clock mask M are supplied to the flip-flop 92 with an EN terminal is described with reference to the timing chart composed of signal waveforms shown as FIGS. 16A through 16G.

At time t6, the write process is switched to the read out process.

At time t1, the master clock CKI (FIG. 16A) is taken to be in L level, the output of the terminal Q (FIG. 16D) be in L level, the clock mask M (FIG. 16F) be in L level, and the output of the terminal XQ (FIG. 16E) be in H level. In this case, the switch 103-3 and the switch 103-6 are turned ON and the switch 103-4 and the switch 103-5 are turned OFF. Further, the switch 103-1 is turned ON and the switch 103-2 is turned OFF. Therefore, the NAND circuit 102-1 is supplied with the clear signal CL (FIG. 16G) being in the normal state of H level and the output signal from the terminal XQ in H level (FIG. 16E), with the resulting output attaining L level (FIG. 16B).

Because the output of terminal XQ (FIG. 16E) is in H level, the NAND circuit 102-2 is supplied with the clear signal (FIG. 16G) of in H level and an output of the NOT circuit 101-6 being in L level with the resulting output therefore attaining H level (FIG. 16C). This output (FIG. 16C) is supplied to the terminal Q vi the switch 103-6 and the NOT circuit 101-7, as well as being supplied to the terminal XQ via switch 103-6, the NOT circuit 101-6 and the NOT circuit 101-8. Namely, the output of the terminal Q and the output for the terminal XQ are determined by the signal supplied by the NAND circuit 102-2 and therefore attain L level (FIG. 16D) and H level, (FIG. 16E), respectively.

At time t2 the level of the clock CK1 (FIG. 16A) becomes H, the switch 103-4 and the switch 103-5 go ON, and the switch 103-3 and switch 103-6 go OFF. Hence, the output of the NAND circuit 102-1 (FIG. 16B) in L level is supplied to the terminal Q via the switch 103-5 and the NOT circuit 101-7 as well as to the terminal XQ via the switch 103-5, the NOT circuit 101-6 and the NOT circuit 101-8. Namely, at time t2, the level of the output of the terminal Q (FIG. 16D) becomes H and the level of the output of the terminal XQ (FIG. 16E) becomes L. Further, the clear signal CL (FIG. 16G) in H level and a signal in H level, which is supplied via the switch 103-5 and the NOT circuit 101-6, are supplied to the NAND circuit 102-2 and the level of the resulting output (FIG. 16C) becomes L.

The NAND circuit 102-1 is supplied with an H level signal via the switch 103-4, for which the L level output of the NAND circuit 102-1 (FIG. 16B) is inverted by the NOT circuit 101-5, and the H level output of the CL terminal (FIG. 16G), with the resulting output thereof being in L level. Namely, the outputs of the terminal Q and the terminal XQ are determined by the signal supplied by the NAND circuit 102-1 with respective levels therefore being in H (FIG. 16D) and L (FIG. 16E).

At a time t3, the level of the clock CK1 (FIG. 16A) becomes L and the switch 103-3 and the switch 103-6 go ON. Therefore, the NAND circuit 102-1 is supplied with the output of the terminal (FIG. 16E) in L level and the clear signal CL in H level and the output of NAND circuit 102-1 (FIG. 16B) therefore changes to be in H level.

The L level output of the terminal XQ (FIG. 16E) allows the NAND circuit 102-2 to be supplied with an H level clear signal (FIG. 16G) and an H level output of the NOT circuit 101-6, with the level of the output of the NAND circuit 102-2 (FIG. 16C) therefore becoming L. Namely, the outputs of terminal Q and the output of the terminal XQ are therefore determined by the signal supplied by the NAND circuit 102-2 and therefore attain H level (FIG. 16D) and L level (FIG. 16E), respectively.

At a time t4 the level of the clock CKI (FIG. 16A) becomes H and the switches 103-4 and 103-5 are turned ON. The output f the terminal Q and the output of terminal XQ are therefore decided by the output of the NAND circuit 102-1 (FIG. 16B) being in H level. Namely, in this case, the level of the output of the terminal Q (FIG. 16D) becomes L and the level of the output of terminal XQ (FIG. 16E) becomes H. Further, in addition to the clear signal (FIG. 16G), in H level the NAND circuit 102-2 is supplied with the L level output of NAND circuit 101-6 and the level of its output (FIG. 16C) therefore becomes H.

At a time t5, the level of the clock CKI (FIG. 16A) becomes L, and the switch 103-3 and the switch 103-6 are turned ON. The H level output of the terminal XQ (FIG. 16E) and the clear signal CL (FIG. 16G) in H level are therefore supplied to the NAND circuit 102-1 and the level of the output of NAND circuit 102-1 (FIG. 16B) therefore becomes L.

Further, because of the output of the terminal XQ (FIG. 16E) being in H level, the clear signal (FIG. 16G) in H level and L level output of the NOT circuit 101-6 supplied to the NAND circuit 102-2 make therefore its output (FIG. 16C) be in H level. Namely, in this case, the level of the output of the terminal Q (FIG. 16D) becomes L and the level of the output of the terminal XQ (FIG. 16E) becomes H.

At a time t6, the level of the clock CK1 (FIG. 16A) becomes H and switch 103-4 and switch 103-5 are turned ON. The output of terminal Q and the output of terminal XQ are therefore decided by the output of the NAND circuit 102-1 (FIG. 16B) in L level. Namely, in this case, the level of the output of the terminal Q (FIG. 16D) becomes H and the level of the output of terminal XQ (FIG. 16E) becomes L. Further, the output of the NOT circuit 101-6 in H level is supplied to the NAND circuit 102-2 in addition to the clear signal (FIG. 16G) in H level, and the output level of the NAND circuit 102-2 (FIG. 16C) therefore becomes L.

Further, the level of the clock mask M (ENI) becomes H at the time t6, the switch 103-1 is turned OFF and the switch 103-2 is turned ON. As a result, thereafter, the output of NOT circuit 101-6 is supplied to the switch 103-3 via the switch 103-2.

At a time t7, the level of the clock CK1 (FIG. 16A) becomes L, and the switch 103-3 and switch 103-6 are turned ON. Further, at this time, the switch 103-1 is turned OFF and the switch 103-2 is turned ON because the clock masks M is in H level. Therefore, a signal for which the level of the output of the NAND circuit 102-2 (FIG. 16C) is inverted at the NOT circuit 101-6, i.e. a signal in level H is supplied to the NAND circuit 102-1. Consequently, the output of the NOT circuit 101-6 (FIG. 16C) in H level and the clear signal CL (FIG. 16G) in H level are supplied to the NAND circuit 102-1, which then gives an output (FIG. 16B) in L level.

The clear signal A clear signal (FIG. 16G) in H level an the output of the NOT circuit 101-6 in H level are supplied to the NAND circuit 102-2 because the output of terminal XQ (FIG. 16E) is in L level, and the NAND circuit 102-2 therefore provides an output (FIG. 16C) in L level, i.e. in this case, the output of the terminal Q (FIG. 16D) is in H level and the output of the terminal XQ (FIG. 16E) is in L level.

At a time t8, the clock CKI (FIG. 16A) whose level becomes H allows both the switch 103-4 and the switch 03-5 to be turned ON. The output of terminal Q and the output of terminal XQ are then decided by the output of the NAND circuit 102-1 (FIG. 16B) in L level, i.e. in this case, the level of the output of the terminal Q (FIG. 16D) becomes H and the level of the output of the terminal XQ (FIG. 16E) becomes L. Further, the output of the NOT circuit 101-6 in H level is also supplied to the NAND circuit 102-2 in addition to the clear signal (FIG. 16G) in H level, and the level of the output of the NAND circuit 102-2 (FIG. 16C) therefore becomes L.

At a time t9, the clock CKI (FIG. 16A) whose level becomes L allows the switch 103-3 and the switch 103-6 to be turned ON. Further, at this time, the switch 103-1 is turned ON because the clock mask M is in L level. The output of the terminal XQ (FIG. 16E) being in L level is therefore supplied to the NAND circuit 102-1. Thus, the output of the terminal XQ in L level and the clear signal CL (FIG. 16G) in L level are supplied to the NAND circuit 102-1, with the output of NAND circuit 102-1 (FIG. 16B) therefore being in H level.

Further, the clear signal (FIG. 16G) in H level and the output of the NOT circuit 101-6 in H level are supplied to the NAND circuit 102-2 because the output of the terminal XQ (FIG. 16E) is in L level, and the level of the output of the NAND circuit 102-2 (FIG. 16C) therefore becomes L, i.e. in this case, the level of the output of terminal Q (FIG. 16D) becomes H and the level of the output of the terminal XQ (FIG. 16E) becomes L.

At a time t10, the clock CKI (FIG. 16A) whose level becomes H allows the switch 103-4 and the switch 103-5 to be turned ON. The output of the terminal Q and the output of the terminal XQ are then decided by the output of the NAND circuit 102-1 (FIG. 16B) being in H level. In this case the level of the output of terminal Q (FIG. 16D) becomes L and the level of the output of terminal XQ (FIG. 16E) becomes H. Further, the output of the NOT circuit 101-6 in L level is supplied to the NAND circuit 102-2 in addition to the clear signal (FIG. 16G) in H level, and the level of the output of the NAND circuit 102-2 (FIG. 16C) therefore becomes H.

In this way, by supplying the master clock CK (FIG. 16A) and a clock mask M (FIG. 16F) to the flip-flop 92 with an EN terminal, the clock CK1 (FIG. 16D) and the clock CK2 (FIG. 16E) both delayed by a half period can be generated at the time t6.

The operation when thus generated clocks CK1 and CK2 are supplied to the RAM 61-1 and the RAM 61-2 of FIG. 8 respectively is described with reference to the timing chart of FIG. 17.

Because the RAM 61-1 and the RAM 61-2 operate at the falling edge of the clock CKI (FIG. 17B) and the clock CK2 (FIG. 17C) respectively, data Dout1 (FIG. 17F) and data Dout2 (FIG. 17G) are outputted in synchronization with these falling edges. When these output data is then selected alternately by the selector 62 in synchronization with the master clock CK (FIG. 17A), the order of the data at the time of switching from writing to reading is data (N-5), data (N-4), data (N-3), data (N-2), data (N-1), data N, data (N-1), data (N-2), data (N-3) and data (N-4). Then, the switch over of the data from wiring to reading is carried out with the data being in the appropriate order.

In this way, at the time of switching of the write processes and the read processes of the survivor sequence information, a delay of half a period is occurred with respect to the phases of clock CK1 and clock CK2, and the data are therefore processed in the appropriate order.

As described above, write and read processing of survivor sequence information is carried out alternately for two RAMs (RAM 61-1 and RAM 61-2), so that Viterbi decoding can then be carried out with a speed approximately twice that of the case when a single RAM is used.

In the aforementioned embodiment the coded data is restricted to that with a constraint length of 7 and a coding rate of ½. However, the present invention can also be applied to various coded data. Further, two RAMs are used as RAMs for an interleaving operation but it is also possible to use more than two RAMs.

According to the Viterbi decoding apparatus and the Viterbi decoding method of the present invention, a high-speed Viterbi decoding using traceback method is possible because a lock of a first phase and a clock of a second phase are generated with the second phase differing from the first phase by half a period, half of the survivor sequence information is stored in correspondence with the first phase clock, the other half of the survivor sequence information is stored in correspondence with the second phase clock and the separately stored survivor sequences information is picked up in a prescribed order.

What is claimed is:

1. A Viterbi decoding apparatus for generating maximum likelihood decoded data as a result of analyzing survivor sequences information stored in a memory unit by carrying out traceback, said Viterbi decoding apparatus comprising:

clock generating means for generating a first clock and a second clock and for delaying said first and second clocks by half a period when traceback is started, said second clock having a phase inverse of that of said first clock;

first memory means for memorizing half of said survivor sequences information in accordance with said first clock;

second memory means for memorizing half of said survivor sequences information in accordance with said second clock; and reading out means for reading out said survivor sequences information memorized in said first memory means and said second memory means in a prescribed order in accordance with said first clock and said second clock, respectively.

2. A Viterbi decoding apparatus according to claim 1, wherein said first memory means and said second memory means carry out memorizing and reading out said survivor sequences information in the same address in accordance with said first clock and said second clock.

3. A Viterbi decoding apparatus according to claim 1 further comprising:

selecting means for selecting one of said survivor sequences information inputted from said first memory means and said second memory means so as to output selected one in accordance with a switching control signal.

4. A Viterbi decoding apparatus according to claim 3, wherein said switching control signal, said first clock and said second clock are signals in synchronism with a master clock.

5. A Viterbi decoding apparatus according to claim 1, wherein said first memory means and said second memory means are composed of memories and divided into prescribed number of memory banks.

6. A Viterbi decoding apparatus according to claim 1, wherein said clock generating means comprises:

mask signal generating means for generating a mask signal in accordance with a starting signal indicating a start of traceback and said master clock; and frequency dividing means for dividing the frequency of said master clock inputted together with said mask signal in half and delaying said first clock and said second clock by half a period thereof in accordance with said mask signal.

7. A Viterbi decoding apparatus according to claim 1 further comprising:

branch metrics calculating means for carrying out calculation of branch metrics for two paths to state to which transitions are possible from a state, said calculation being carried out for all of states being determined by constraint lengths; and Add Compare Select means for carrying out with respect to each of said two paths addition of said branch metric outputted from said branch metrics calculating means and a path metric of a state from which a transition has been made, and for carrying out selection of a smaller metric presented as a smaller one of the results of said addition, said Add Compare Select means making the result of said selection be memorized in one of said first memory means and said second memory means.

8. A method of carrying out Viterbi decoding for generating maximum likelihood decoded data as a result of analyzing survivor sequences information stored in a memory unit by carrying out traceback, said method comprising the steps of:

generating a first clock and a second clock, said first and second clocks being delayed by half a period when traceback is started, said second clock having a phase inverse of that of said first clock;

memorizing half of said survivor sequences information in first memory means in accordance with said first clock;

memorizing half of said survivor sequences information in second memory means in accordance with said second clock; and reading out said survivor sequences information memorized in said first memory means and said second memory means in a prescribed order in accordance with said first clock and said second clock, respectively.

9. A method of carrying out Viterbi decoding according to claim 8, wherein said steps of memorizing and reading out said survivor sequences information in said first memory means and said second memory means are carried out in the same address in accordance with said first clock and said second clock.

10. A method of carrying out Viterbi decoding according to claim 8 further comprising the steps of:

selecting one of said survivor sequences information read out from said first memory means and said second memory means for being outputted.

11. A method of carrying out Viterbi decoding according to claim 8 further comprising the steps of:

carrying out calculation of branch metric for two paths to states to which transitions are possible from a state, said calculation being carried out for all of states being determined by constraint lengths;

carrying out with respect to each of said two paths addition of said branch metric outputted from said branch metrics calculating means and a path metric of a state from which a transition has been made;

carrying out selection of a smaller metric presented as a smaller one of the results of said addition; and memorizing the result of said selection in one of said first memory means and said second memory means.

* * * * *